(12) United States Patent
Imai

(10) Patent No.: US 6,920,070 B2
(45) Date of Patent: Jul. 19, 2005

(54) READ/PROGRAM POTENTIAL GENERATING CIRCUIT

(75) Inventor: Kimimasa Imai, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 123 days.

(21) Appl. No.: 10/669,557

(22) Filed: Sep. 25, 2003

(65) Prior Publication Data
US 2005/0013188 A1 Jan. 20, 2005

(30) Foreign Application Priority Data
Jul. 17, 2003 (JP) .................................. 2003-276102

(51) Int. Cl.$^7$ .............................................. G11C 16/04
(52) U.S. Cl. ........................ 365/189.09; 365/225.7; 365/185.09
(58) Field of Search ................... 365/189.09, 225.7, 365/185.09

(56) References Cited

U.S. PATENT DOCUMENTS 6,278,651 B1    8/2001   Weinfurtner et al.
6,327,178 B1 *  12/2001  Blodgett ..................... 365/177
6,333,667 B2    12/2001  Lee
6,400,632 B1 *  6/2002   Tanizaki et al. ......... 365/225.7
6,496,418 B2 *  12/2002  Kawahara et al. ..... 365/185.18

FOREIGN PATENT DOCUMENTS

JP     2001-67893    3/2001
JP     2002-203901   7/2002

* cited by examiner

*Primary Examiner*—Richard Elms
*Assistant Examiner*—Tuan T. Nguyen
(74) *Attorney, Agent, or Firm*—Oblon, Spivak, McClelland, Maier & Neustadt, P.C.

(57) ABSTRACT

At a Power-On time, a read potential is generated by a VBP generating circuit (Power-On). The read potential is applied as VBP to a program element to check the state of the program element. The read potential is produced from, e.g. a logic power supply potential. At a program time, a program potential is generated by a VBP generating circuit (Program). The program potential is supplied, for example, from the outside of the chip. The program potential is applied as VBP to the program element. While the read/program potential is being output, the gate of a barrier transistor is supplied with VBT, e.g. a power supply potential.

18 Claims, 12 Drawing Sheets

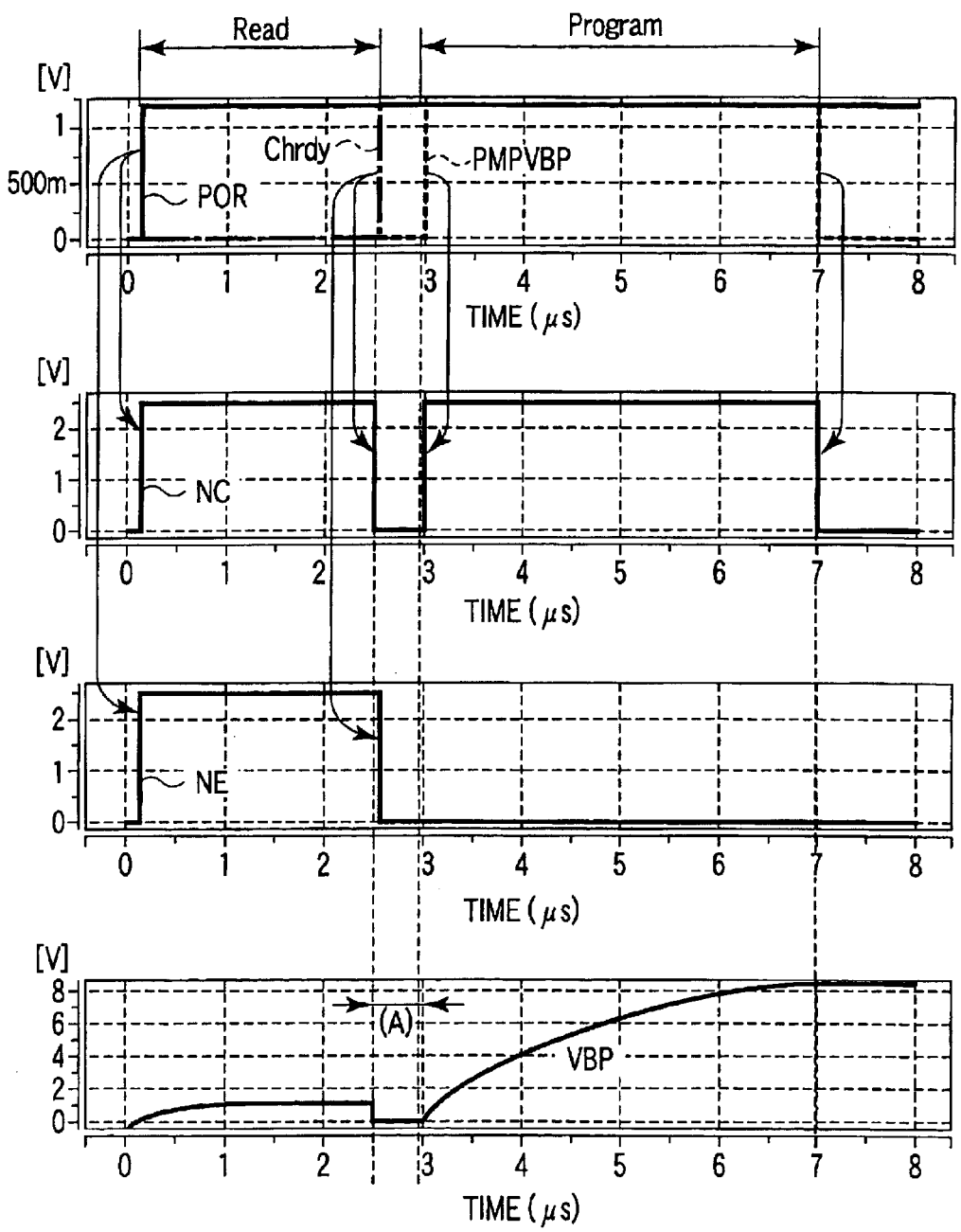
F I G. 4

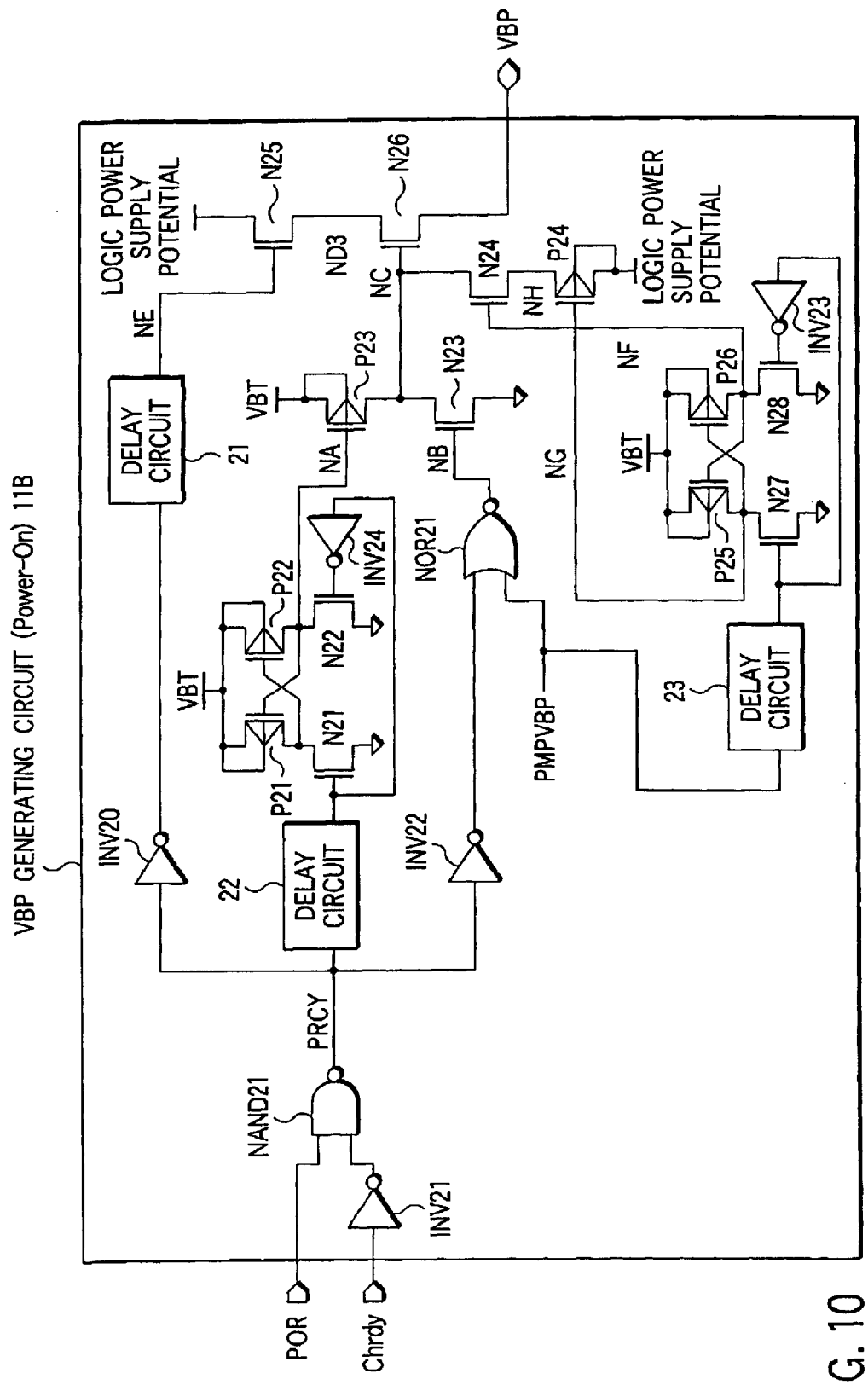
F I G. 10

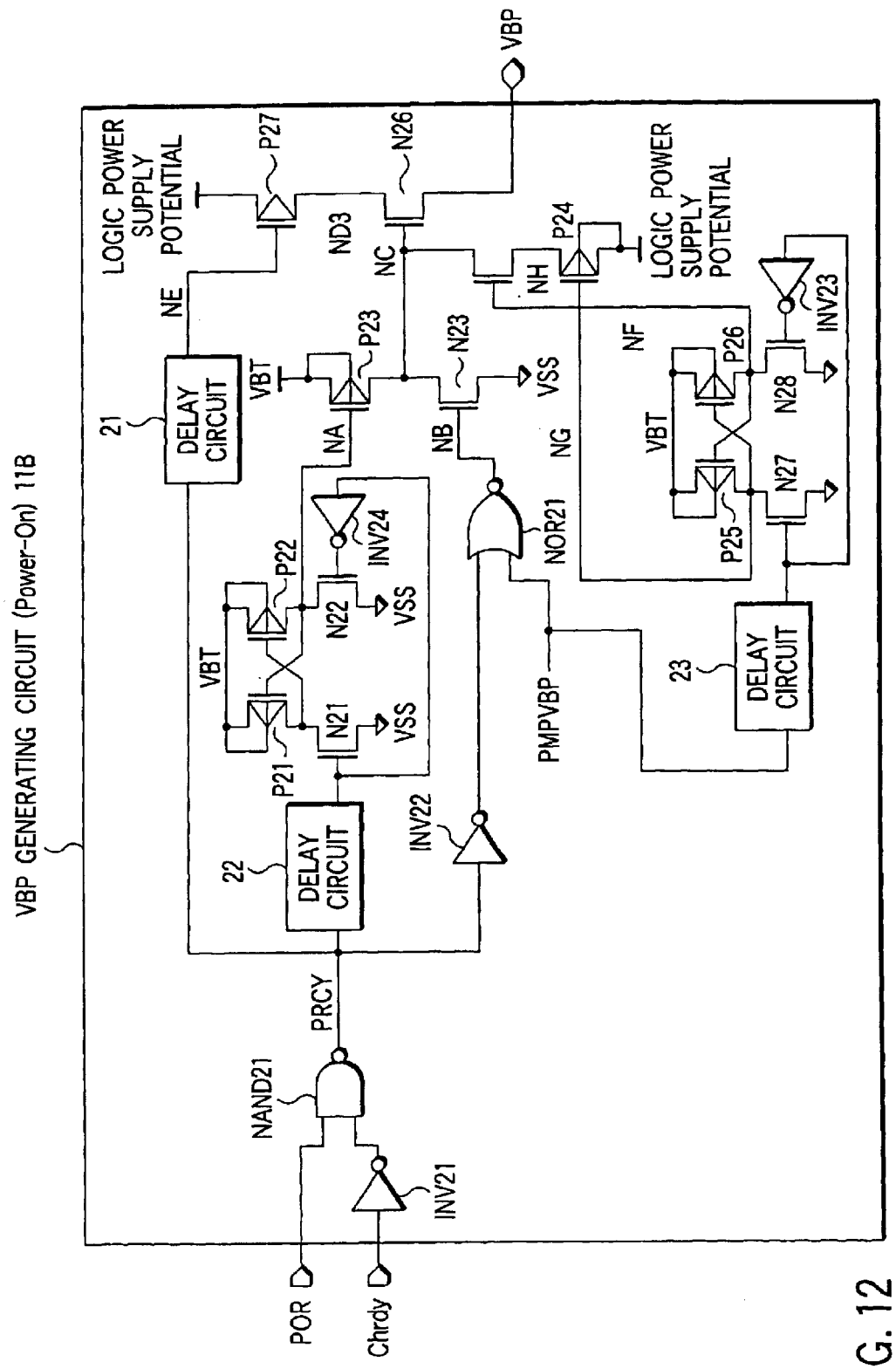
F I G. 12

READ/PROGRAM POTENTIAL GENERATING CIRCUIT

CROSS-REFERENCE TO RELATED APPLICATIONS

This application is based upon and claims the benefit of priority from the prior Japanese Patent Application No. 2003-276102, filed Jul. 17, 2003, the entire contents of which are incorporated herein by reference.

BACKGROUND OF THE INVENTION

1. Field of the Invention

The present invention relates to a read/program potential generating circuit of an electrically programmable device, in particular, for use in a fuse circuit comprising, e.g. an E (electrical)-fuse element or an antifuse element.

2. Description of the Related Art

In the field of semiconductor memories, a redundancy technique for remedying a chip by replacing a defective cell with a redundant cell is well known. The redundancy technique is adopted for the purpose of enhancing a chip yield at the time of a die sort test.

However, with developments in miniaturization of devices and an increase in number of functions (i.e. reduction of circuit margin) in recent years, there is a tendency that the defect ratio of chips in tests after assembly increases more and more. The increase in defect ratio leads to a rise in product cost. Thus, in these years, there is a demand for remedying a chip with a defective cell once again by redundancy technology after a packaging step.

Under the circumstances, in order to make it possible to program the address (defective address) of a defective cell even after the packaging step, a program device of a fuse circuit for storing the defective address tends to be changed from a laser fuse to an electrically programmable electrical fuse (e.g. an E-fuse element or an antifuse element).

Around 1992, FPGA (Field Programmable Gate Array) makers began to develop products which permit replacement of a defective cell with a redundant cell even after a packaging step. This technique relates to a "memory scheme", that is, a scheme in which a defective address is stored by using the same device as a memory device in a memory array. Consequently, such problems arise that in a memory-embedded logic LSI, for instance, adjustment in timing between a memory and a logic (gate array) becomes difficult, and an increase in operation speed is difficult due to an inter-logic delay. At present, after all, even such FPGA makers are now developing a fuse circuit using an electrical fuse element, in particular, an antifuse element.

The antifuse element refers to a fuse element composed of a capacitor. It has a logic reverse to the logic of an ordinary fuse element (e.g. a laser fuse element, E-fuse element, etc.), and so this is called "antifuse" element. For example, in the case of the ordinary fuse element, the initial state (non-fusion-cut state) is the conductive state. When the ordinary fuse element is blown and fusion-cut ("programmed") by a laser beam or an excessive current, the fuse element is set in the non-conductive state. In the case of the antifuse element, the initial state (non-destruction state of insulation layer) is the non-conductive state. When the insulation layer is destroyed ("programmed") by excessive voltage, the antifuse element is set in the conductive state.

An ONO (oxide/nitride/oxide) layer is known as an insulation layer of the antifuse element. This insulation layer may be replaced with a semiconductor layer of, e.g. amorphous silicon. Further, DRAM makers have published an antifuse element using a capacitor of a stacked memory cell, and an antifuse element using an inter-gate insulation layer (ONO) of an EEPROM memory cell.

In the meantime, as is shown in FIG. 1, in a general LSI, in order to perform a cell replacement operation using a redundancy circuit after assembly, programming for a program element 12 is effected using a high potential VBP generated by a high potential generating circuit (VBP generating circuit) 11.

In the circuit shown in FIG. 1, at a Power-ON time, in order to confirm the state (conductive state/non-conductive state) of the program element 12, a high potential VBP is generated by the high potential generating circuit (VBP generating circuit) 11. In addition, at a Program time, in order to effect programming for the program element 12, the high potential generating circuit (VBP generating circuit) 11 generates a high potential VBP. In short, the high potential VBP is generated by the high potential generating circuit 11 in each of the state confirmation operation of the program element at the Power-On time and the programming operation at the Program time.

No problem arises in the case of an LSI, such as a general DRAM, in which an access (program) operation for the program element 12 is performed by the manufacturer side alone. However, the following problems arise in the case of an LSI, such as a DRAM-embedded logic LSI, in which an access (program) operation for the program element 12 can also be performed by the user side.

A first problem is as follows. The feature that the program element 12 can be programmed by the user side is necessary for the user. In this case, it is desirable that a chip using a laser fuse and a chip using an electrically programmable program element be handled similarly. However, in the case of the latter chip, as shown in FIG. 1, the high potential VBP for programming, which is generated by the high potential generating circuit 11, is always applied to elements such as the program element and barrier transistor.

A second problem is as follows. In general, the potential used for an embedded LSI such as a memory-embedded logic LSI is set to be lower than the potential used for a general LSI such as a general memory. It is difficult to produce a potential necessary for programming from this low potential. To solve this problem as regards general LSIs, Patent Document 3 (see the list below), for instance, proposes a two-stage boost architecture using two-stage boost circuits, and Patent Document 4 proposes an architecture using a negative potential generating circuit. In these approaches, however, a plurality of this type of circuits need to be arranged in order to obtain a necessary negative drive power.

A third problem is as follows. Normally, in a general LSI, the high potential VBP is constantly generated during a time period from Power-On to Power-Off. On the other hand, the thickness of a gate insulation layer of a transistor used in the embedded LSI is smaller than the thickness of a gate insulation layer of a transistor used in the general LSI. Hence, in the embedded LSI, there is a danger that the transistor is damaged by the high voltage VBP, and this poses a problem with the reliability of the transistor.

Documents relating to the above-described "Related Art" are listed below:

Patent Document 1: Jpn. Pat. Appln. KOKAI Publication No. 2001-67893

Patent Document 2: Jpn. Pat. Appln. KOKAI Publication No. 2002-203901

Patent Document 3: U.S. Pat. No. 6,278,651
Patent Document 4: U.S. Pat. No. 6,333,667.

BRIEF SUMMARY OF THE INVENTION

A read/program potential generating circuit according to an example of the present invention comprises: a first potential generating circuit that generates a program potential necessary for programming for a fuse element; and a second potential generating circuit that generates a read potential necessary for checking a state of the fuse element, wherein a value of the read potential is lower than a value of the program potential.

A read/program method according to an example of the present invention comprises: generating a read potential in sync with Power-On; applying the read potential to a fuse element, thereby checking a state of the fuse element; generating a program potential higher than the read potential, based on a command from a CPU; and applying the program potential to the fuse element, thereby executing programming for the fuse element.

BRIEF DESCRIPTION OF THE SEVERAL VIEWS OF THE DRAWING

FIG. 4 shows operational waveforms in the circuit shown in FIG. 3;

FIG. 10 shows an example of a VBP generating circuit according to a third embodiment of the present invention;

FIG. 12 shows an example of a VBP generating circuit according to a fourth embodiment of the present invention;

DETAILED DESCRIPTION OF THE INVENTION

Referring now to the accompanying drawings, best modes for carrying out examples of the present invention will be described in detail.

1. Outline

A read/program potential generating circuit according to an example of the present invention includes, for instance, a first potential generating circuit and a second potential generating circuit. When the state (conductive state/non-conductive state) of a program element is checked at the time of, e.g. Power-ON, the first potential generating circuit produces a read potential necessary for checking the state. At the time of programming the program element, the second potential generating circuit produces a program potential (greater than a read potential) necessary for programming (e.g. destruction of an insulation layer in an antifuse).

In this way, the potential applied to the program element at the time of read (test) is made different from the potential applied to the program element at the time of programming. Thereby, for example, a high load state of the program element at the time of the state check can be eliminated. In addition, by providing the first and second potential generating circuits, as mentioned above, the constraints imposed on the layout of the program element are relaxed.

In the first and second potential generating circuits, during the time period from Power-On to Power-Off, the read/program potential is not always applied to the program element. In the time period other than the read/program time for the program element, a ground potential is applied to the program element.

As stated above, the read/program potential is applied to the program element, only when necessary. Thereby, excessive voltage stress to the program element, barrier transistor, etc., can be avoided.

2. First Embodiment

In a first embodiment of the present invention, a read/program potential generating circuit comprises a VBP generating circuit (Power-On) that produces a necessary read potential at the time of Power-On (read), and a VBP generating circuit (Program) that produces a necessary program potential (greater than a read potential) at the time of programming the program element. Thereby, a high load state of the program element at the time of read can be eliminated, and the constraints imposed on the layout of the program element are relaxed. With this structure, too, the same handling as with the LSI using the ordinary laser fuse can be enabled by the user side.

Specific examples of the first embodiment are described.

(1) Read/Program Potential Generating Circuit

Figure 1:
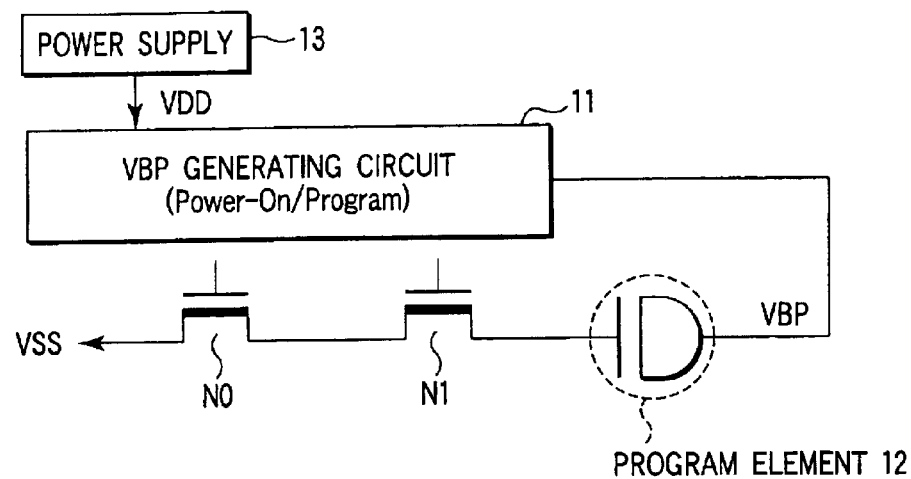
FIG. 1 shows a conventional potential generating circuit.
Figure 2:
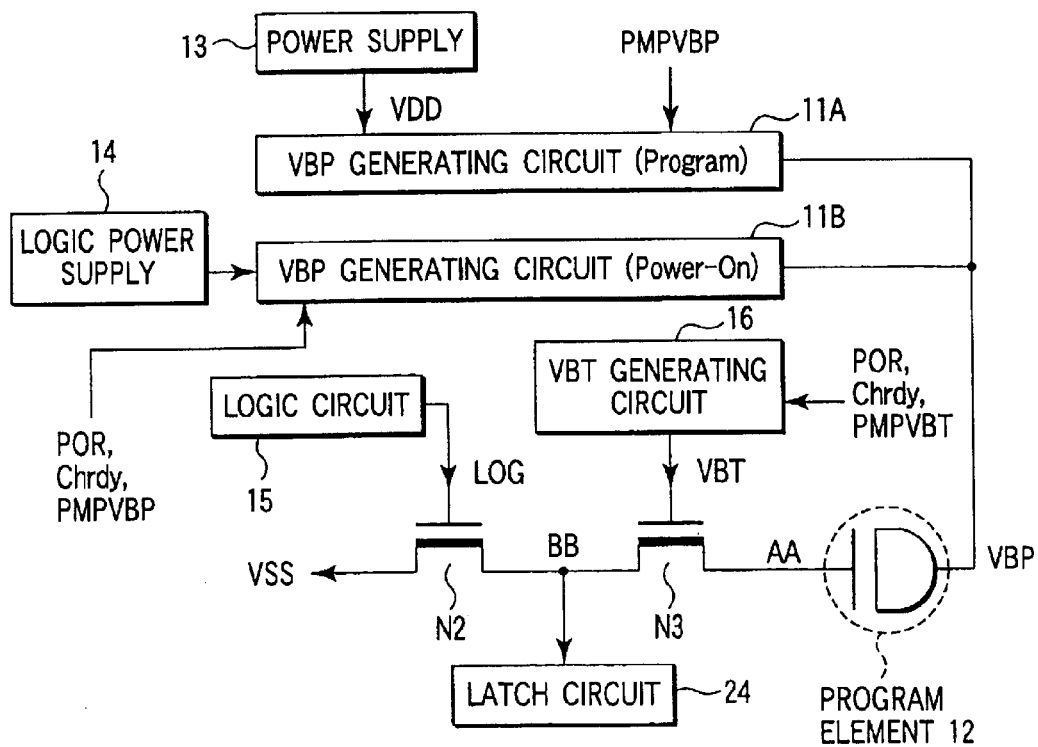
FIG. 2 shows a potential generating circuit according to a first embodiment of the present invention.

FIG. 2 shows a read/program potential generating circuit according to the first embodiment of the present invention and its peripheral circuits.

A VBP generating circuit (Program) 11A is a circuit for generating a program potential. At the time of programming, a program potential is applied as VBP to one end of a program element 12. A program signal PMPVBP is a signal for operating the VBP generating circuit (Program) 11A. While the program signal PMPVBP is at "H" level, the VBP generating circuit 11A is set in the operative state.

The program signal PMPVBP is generated based on a command supplied from a CPU. When the command represents "Program", the program signal PMPVBP is set at the "H" level. The CPU may be provided in a single chip along with the read/program potential generating circuit, or it may be formed in an independent chip. A power supply 13 supplies a power supply potential (e.g. about 3.5 V) VDD to the VBP generating circuit 11A.

A VBP generating circuit (Power-On) 11B is a circuit for generating a read potential. In a state check (read) of the program element 12 at the time of Power-On, the read potential is applied as VBP to one end of the program element 12. The read potential has a value necessary for checking the state of the program element 12. Normally, this value is lower than the program potential. The VBP generating circuit 11B is supplied with a logic power supply potential (e.g. about 1.2 V) from a logic power supply 14.

Control signals POR, Chrdy and PMPVBP are signals for controlling the operation of the VBP generating circuit 11B.

N-channel MOS transistors N2 and N3 are connected in series to the other end of the program element 12. A ground potential VSS is input to the source of the transistor N2, and the drain of the transistor N2 is connected to the source of the transistor N3. A logic signal LOG is input to the gate of the transistor N2.

A logic circuit 15 generates the logic signal LOG. The logic signal LOG is a select signal generated based on an address signal. The signal LOG is set at the "H" level when programming of the program element 12 is executed.

The source of the transistor N3 is connected to the drain of the transistor N2. The drain of the transistor N3 is connected to the aforementioned other end of the program element 12. The gate of the transistor N3 is supplied with a high potential (e.g. about 3.5 V) VBT. A VBT generating circuit 16 generates the high potential VBT on the basis of control signals POR, Chrdy and PMPVBP.

The transistor N3 has a function of a barrier transistor. Specifically, the transistor N3 functions to prevent the high potential VBP from reaching the transistor N2, after the programming (e.g. destruction of an insulation layer in the case of an antifuse). For example, when the program element 12 is already in the program state (conductive state) at the time of programming, the VBT is at the "L" level and the transistor N3 is turned off.

At the time of read, a node BB is connected to a latch circuit 24, and the logic signal LOG is set at "L" and the VBT is set at "H". As a result, the state (conductive state/non-conductive state) of the program element 12 is latched by the latch circuit 24.

(2) VBP Generating Circuit (Power-On)

Figure 3:
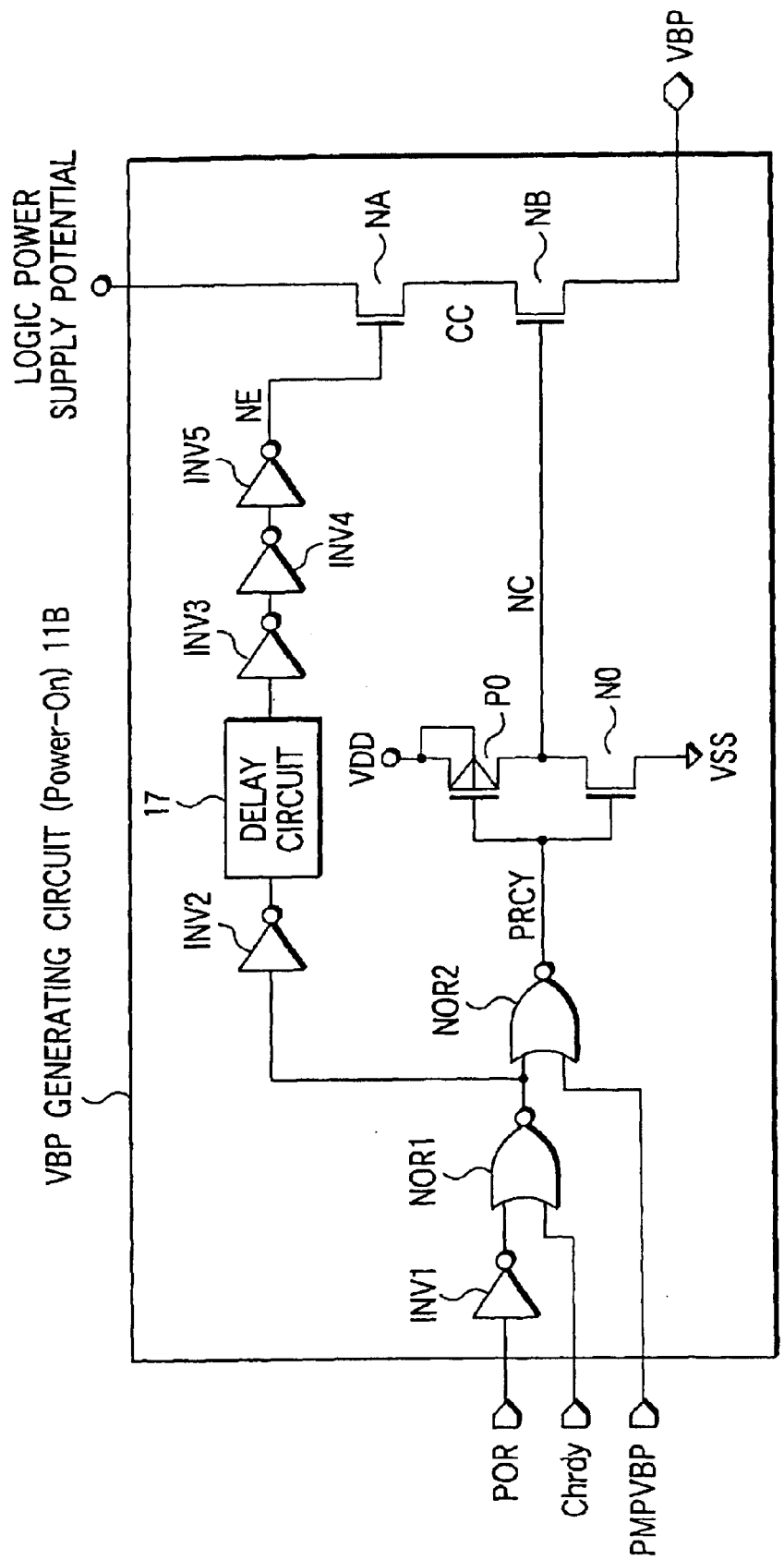
FIG. 3 shows an example of a VBP generating circuit.

FIG. 3 shows an example of the VBP generating circuit (Power-On). FIG. 4 shows operational waveforms in the circuit shown in FIG. 3.

A chip activation signal POR is a signal which is set at the "H" level when power is supplied to the chip. The signal POR is input to a NOR circuit NOR1 via an inverter INV1. A fuse latch operation completion signal Chrdy is a signal which is set at the "H" level when fuse data is latched in the latch circuit. The signal Chrdy is input to the NOR circuit NOR1. A program signal PMPVBP and an output signal of the NOR circuit NOR1 are input to a NOR circuit NOR2.

An output signal PRCY of the NOR circuit NOR2 is input to the gate of a P-channel MOS transistor P0 and the gate of an N-channel MOS transistor N0. The source of the transistor P0 is supplied with a power supply potential (e.g. a power supply potential of about 3.5 V supplied from a DRAM core). The source of the transistor N0 is supplied with a ground potential VSS. An output signal NC is obtained from the drains of the transistors P0 and N0. The output signal NC is delivered to the gate of an N-channel MOS transistor NB.

On the other hand, the output signal of the NOR circuit NOR1 is input to a delay circuit 17 via an inverter INV2. An output signal from the delay circuit 17 passes through inverters INV3, INV4 and INV5 and is then supplied as a signal NE to the gate of an N-channel MOS transistor NA. The drain of the transistor NA is supplied with a logic power supply potential (e.g. about 1.2 V, about 2.5 V) from the logic circuit. A signal VBP is obtained from the source of the transistor NB. The source of the transistor NA and the drain of the transistor NB are mutually connected.

The potential applied to the gates of the transistors NA and NB is a power supply potential (e.g. about 3.5 V) VDD supplied from the DRAM core, and the gate potential of the transistors NA and NB is higher than the logic power supply potential (e.g. about 1.2 V, about 2.5 V).

The basic operations are described.

① Read (Power-On) Time

If the chip activation signal POR is set at the "H" level by Power-On in the state in which Chrdy="L" and PMPVBP="L", both nodes NC and NE are set at the "H" level. At this time, since the transistors NA and NB are turned on, the logic power supply potential (e.g. about 1.2 V) is output as VBP. If fuse data is read out and latched in the latch circuit, the fuse latch operation completion signal Chrdy rises to the "H" level and both nodes NC and NE are set at the "L" level.

In the present example, if the fuse latch operation completion signal Chrdy rises to the "H", the node NC first comes to the "L" level and, after a predetermined time period, the node NE comes to the "L" level. In this way, a predetermined delay time is set in the path from the output terminal of the NOR circuit NOR1 to the gate of the transistor NA, in order to charge the connection node CC of the transistors NA and NB to the logic power supply potential.

② Program Time

If the program signal PMPVBP rises to the "H" level, the node NC rises to the "H" level. During the time period in which the program signal PMPVBP is at the "H" level, the node NC is fixed at the "H" level. At the program time, a high potential (e.g. about 8 V) VBP is output from the VBP generating circuit 11A (see FIG. 2). Thus, if the node NC comes to the "L" level, there is a possibility that the gate of the transistor NB is destroyed. In order to ensure the reliability of the transistor NB, the node NC is fixed at the "H" (e.g. about 3.5 V) level.

At this time, the node NE is at the "L" level and the transistor NA is in the off-state. However, since the connection node CC of the transistors NA and NB is charged to the logic power supply potential (e.g. about 1.2 V) at the read time, stress on the transistor NB is relaxed.

③ Others

A time period (A) is neither the read time period nor the program time period. In the time period (A), there is no need to supply VBP from the VBP generating circuit 11A, 11B. Thus, in the time period (A), the signals POR and Chrdy are set at the "H" level, the signal PMPVBP is set at the "L" level, and the nodes NC and NE are set at the "L" level. At this time, the VBP is set at 0 V.

The read operation is executed in sync with Power-On. The program operation is executed, for example, on the basis of a command from the CPU.

(3) Load Drive Power

Next, a description is given of the structure capable of ensuring a sufficient load drive power in an embedded LSI such as a memory-embedded logic LSI. In the present example, in order to ensure a high potential VBP having a sufficient load drive power at the program time, a dedicated power supply pin is newly provided in order to take into the chip a program potential generated from the outside of the chip.

Figure 5:
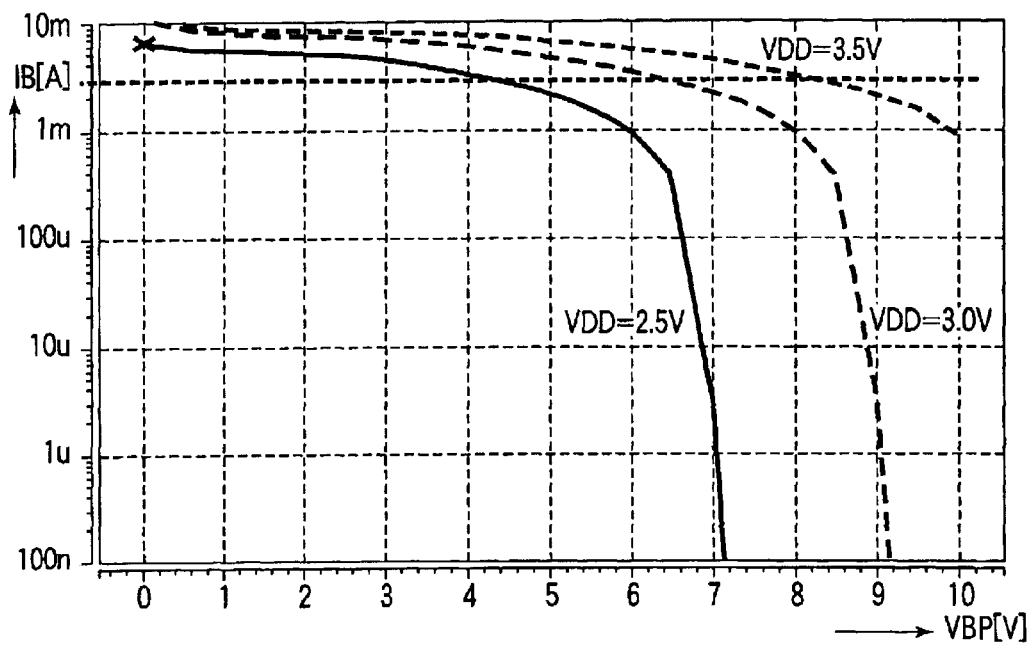
FIG. 5 is a graph for explaining a load drive power.

FIG. 5 shows load characteristics of the program potential generating circuit.

As regards the load characteristics, it is assumed that a program potential is generated within the chip by using the power supply potential VDD. The abscissa indicates the potential VBP at the output terminal of the program potential generating circuit, and the ordinate indicates the current IBP flowing at the output terminal of the program potential generating circuit.

As is understood from the load characteristics, when it is required that, for example, the program potential be about 8 V and the load current be higher than 3 mA, it is necessary that the power supply potential VDD be about 3.5 V. If about 3 V is used as the power supply potential VDD, a necessary load performance cannot be achieved unless a plurality of program potential generating circuits are provided.

In the field of embedded LSIs and general LSIs, the value of power supply potential VDD has decreased in recent years, and it has become difficult to realize the necessary load performance. In usual cases, a decrease in load performance is suppressed by using a plurality of program potential generating circuits. In this case, however, such a problem arises that the layout area increases.

In addition, in the prior art, in the case where the potential to be applied to the program element at the time of Power-On (read) is generated by the program potential generating circuit, the potential generating circuit falls in an over-performance state. As a result, at the time of Power-On, an unintended adverse effect, such as destruction of the program element, may possibly occur.

As regards the embedded LSI, it is considered that in most cases there are unused pins of the package, and a dedicated power supply pin for programming is newly added. Thus, a program potential is supplied, for example, from the outside of the chip to the inside of the chip via the dedicated power supply pin. Thereby, the number of program potential generating circuits, i.e. the number of VBP generating circuits (Program), can be reduced to one.

Moreover, the program potential generating circuit (VBP generating circuit (Program)) and the read potential generating circuit (VBP generating circuit (Power-On)) are separated. At the time of read, the read potential (greater than a program potential) is applied to the program element. Thereby, the program element can be prevented from suffering unnecessary voltage stress.

Besides, in the present example, the read potential generating circuit (VBP generating circuit (Power-On)) is newly added. However, since only one program potential generating circuit (VBP generating circuit (Program)) is used, it is possible to provide a read/program potential generating circuit with a reduced layout size and with no constraints on the layout.

(2) Re: Reliability of Transistors

In order to ensure the reliability of transistors, the following structure is adopted.

If a voltage stress is always applied to a transistor during a time period from Power-On to Power-Off, the transistor may possibly be destroyed. To avoid this, a voltage stress is prevented from acting on the transistor in a time period other than the time of read/program for the program element.

In this way, an excessive voltage stress on the program element and elements such as a barrier transistor connected to the program element is avoided, and thus the reliability of the elements is enhanced.

Specific examples are described.

Figure 6:
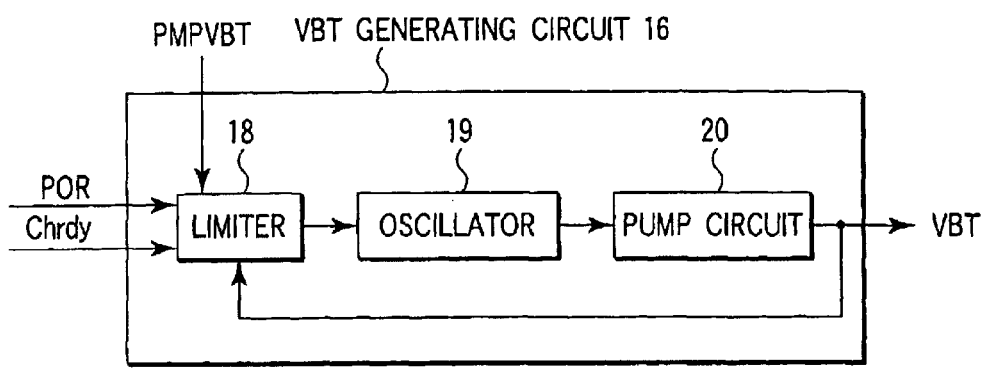
FIG. 6 shows an example of a VBT generating circuit.

FIG. 6 shows an example of the VBT generating circuit.

Control signals POR, Chrdy and PMPVBT are input to a limiter 18. An oscillator 19 operates based on an output signal from the limiter 18. An output from the oscillator 19 is input to a pump circuit 20. An output signal of the pump circuit 20 becomes VBT and this signal is fed back to the limiter 18. Thereby, the level of the output signal VBT of the pump circuit 20 can be kept constant.

Figure 7:
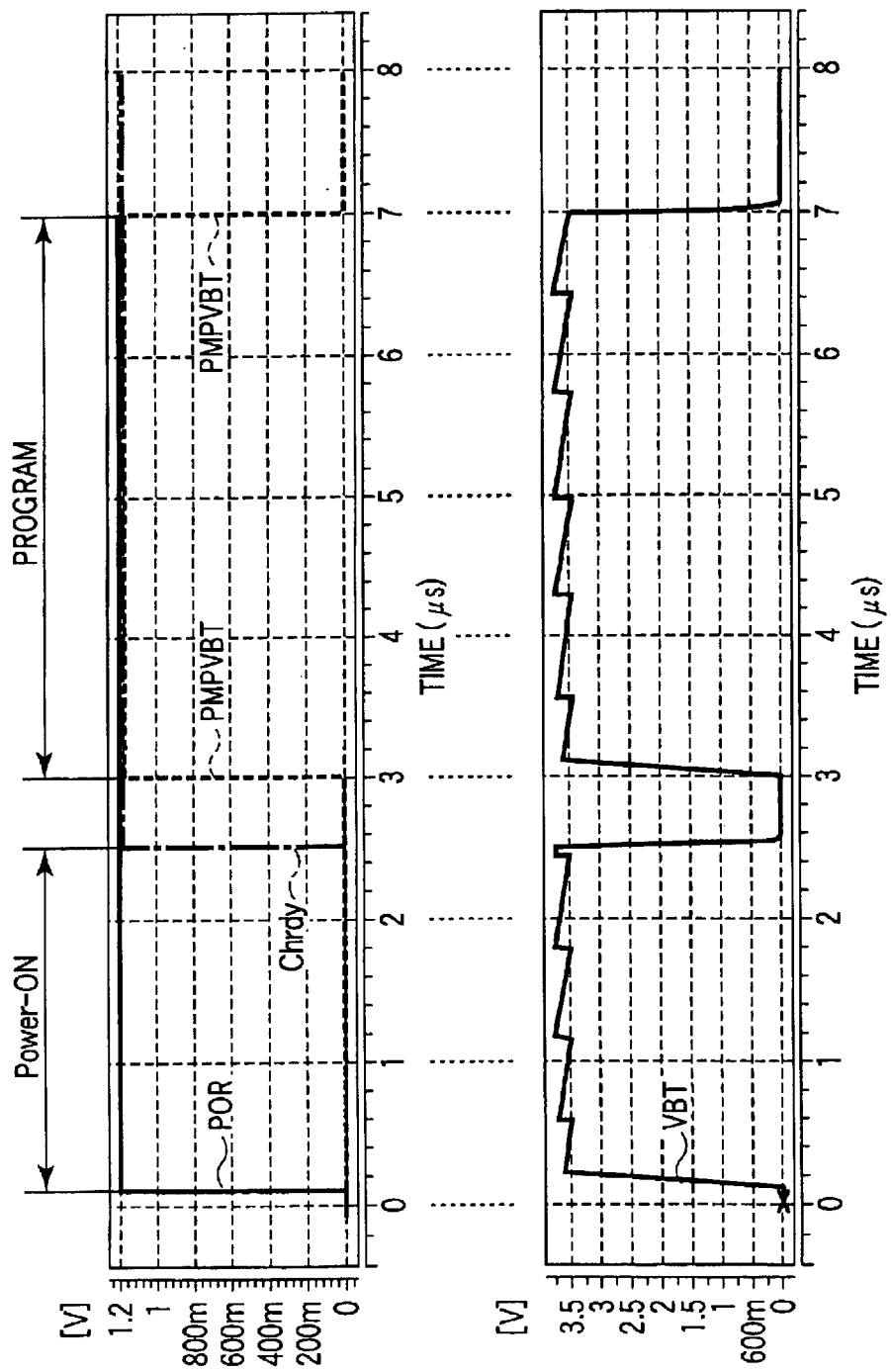
FIG. 7 shows operational waveforms in the circuit shown in FIG. 6.

FIG. 7 shows operational waveforms in the VBT generating circuit shown in FIG. 6.

At the time of Power-On (read), if the chip activation signal POR rises to the "H" level, the VBT generating circuit is rendered operative. As a result, the signal VBT of, e.g. about 3.5 V is output. The VBT is applied to the gate of the barrier transistor N3 shown in FIG. 2. Thereafter, if the fuse latch operation completion signal Chrdy is set at the "H" level, the VBT generating circuit is rendered inoperative and the VBT falls to 0 V.

At the program time, while the program signal PMPVBP is at the "H" level, the signal VBT of, e.g. about 3.5 V is output from the VBT generating circuit 16. The VBT is applied to the gate of the barrier transistor N3 shown in FIG. 2. If the program signal PMPVBP falls to the "L" level, the VBT generating circuit is rendered inoperative and the VBT falls to 0 V.

In a time period between the Power-On time and the Program time, all of the control signals POR, Chrdy and PMPVBT are at the "L" level and the VBT is at the ground potential VSS.

3. Second Embodiment

Compared to the first embodiment, a second embodiment of the invention is characterized by the structure of the VBP generating circuit (Power-On). In the second embodiment, too, the read/program potential generating circuit and its peripheral circuits have the same structure as shown in FIG. 2.

Figure 8:
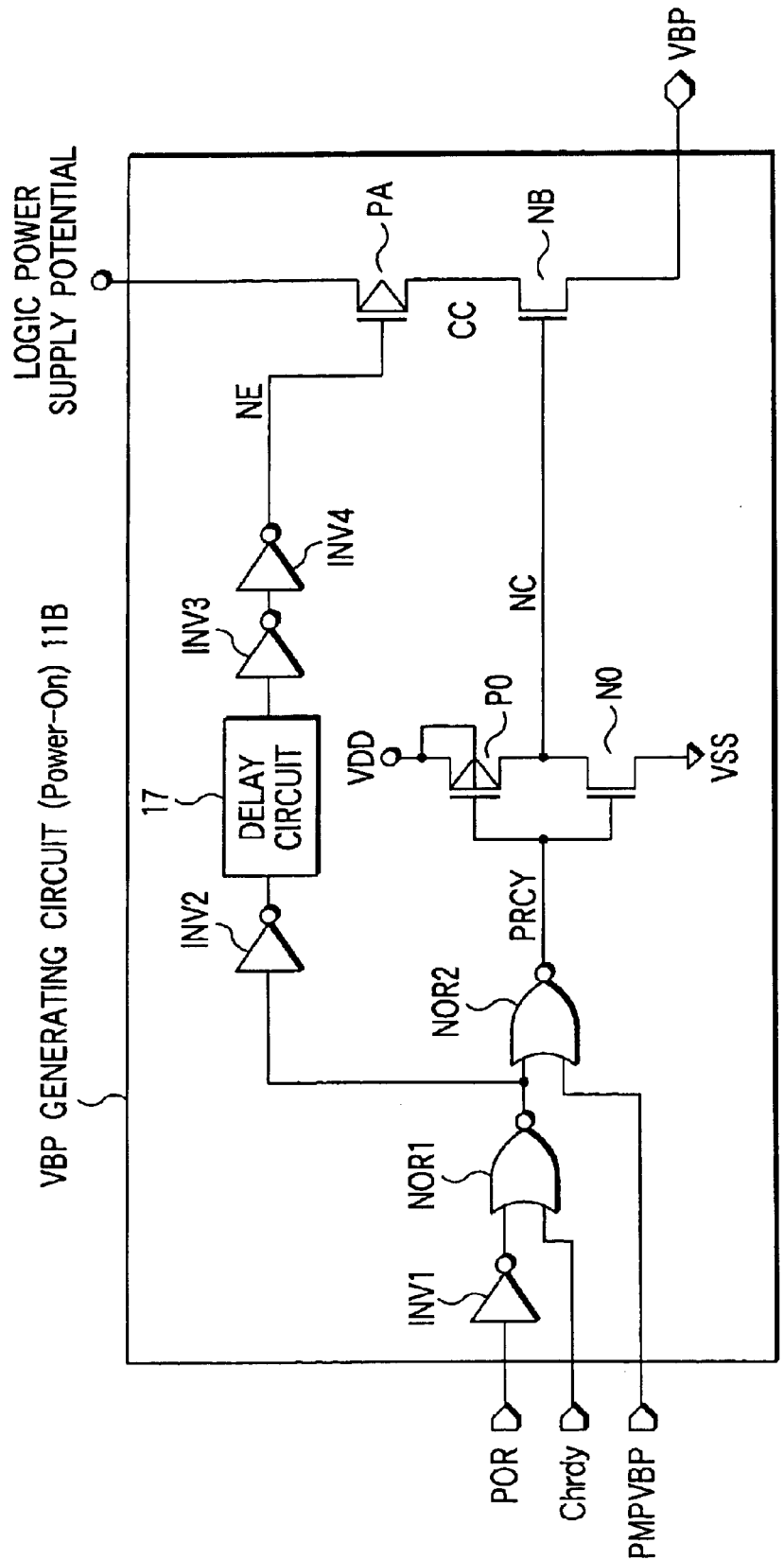
FIG. 8 shows an example of a VBP generating circuit according to a second embodiment of the present invention.
Figure 9:
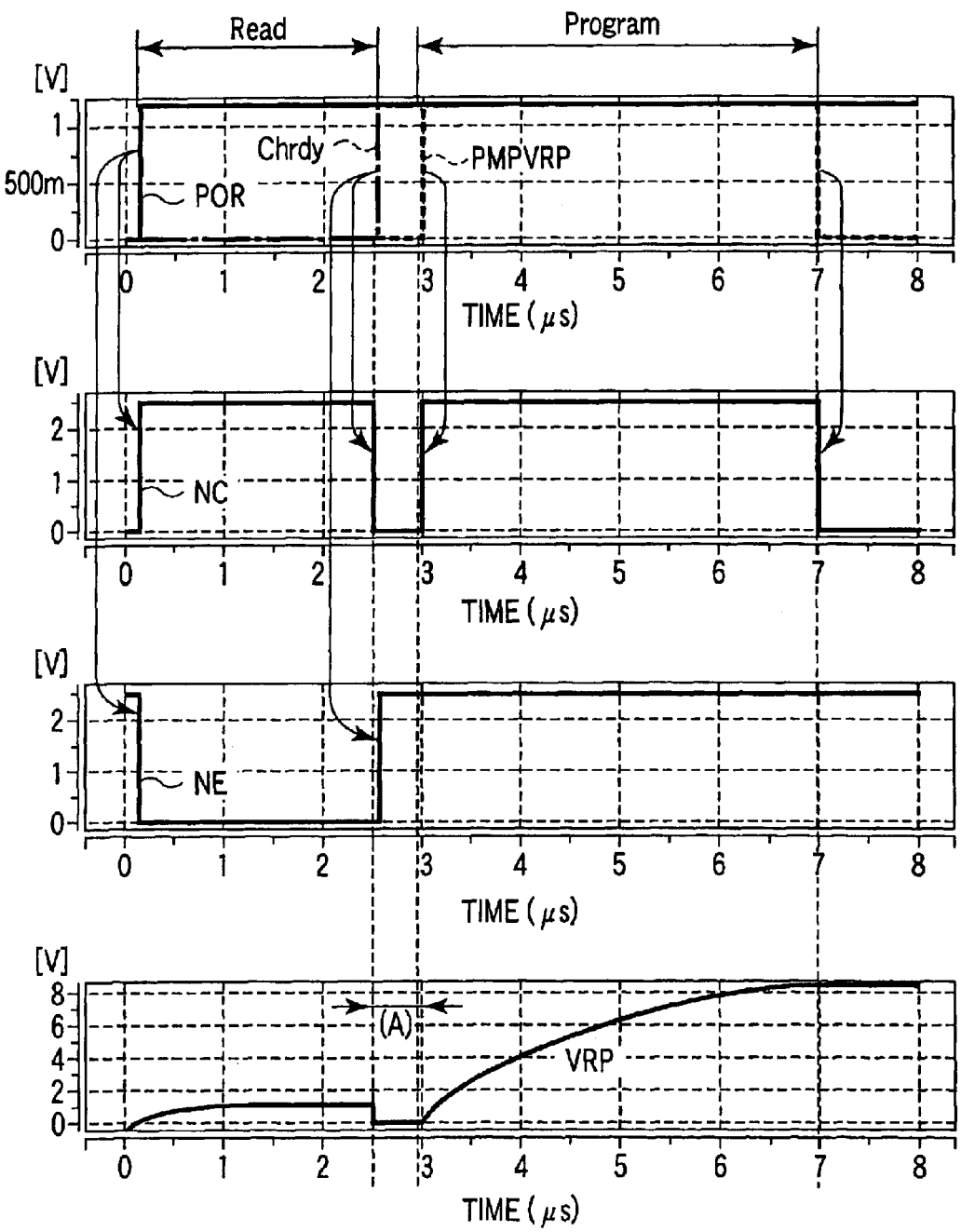
FIG. 9 shows operational waveforms in the circuit shown in FIG. 8.

FIG. 8 shows an example of the VBP generating circuit (Power-On). FIG. 9 shows operational waveforms in the circuit shown in FIG. 8.

A chip activation signal POR is input to a NOR circuit NOR1 via an inverter INV1. A fuse latch operation completion signal Chrdy is input to the NOR circuit NOR1. A program signal PMPVBP and an output signal of the NOR circuit NOR1 are input to NOR circuit NOR2.

An output signal PRCY of the NOR circuit NOR2 is input to the gate of a P-channel MOS transistor P0 and the gate of an N-channel MOS transistor N0. The source of the transistor P0 is supplied with a power supply potential VDD. The source of the transistor N0 is supplied with a ground potential VSS. An output signal NC is obtained from the drains of the transistors P0 and N0. The output signal NC is delivered to the gate of an N-channel MOS transistor NB.

The output signal of the NOR circuit NOR1 is input to a delay circuit 17 via an inverter INV2. An output signal from the delay circuit 17 passes through inverters INV3 and INV4 and is then supplied as a signal NE to the gate of a P-channel MOS transistor PA. The source of the transistor PA is supplied with a logic power supply potential from the logic circuit. A signal VBP is output from the source of the transistor NB. The drain of the transistor PA and the drain of the transistor NB are mutually connected.

The potential applied to the gates of the transistors PA and NB is a power supply potential VDD supplied from the DRAM core, and the gate potential of the transistors PA and NB is higher than the logic power supply potential.

The basic operations are described.

At the read (Power-On) time, if the chip activation signal POR is set at the "H" level by Power-On in the state in which Chrdy="L" and PMPVBP="L", the node NC is set at the "H" level and the node NE is set at the "L" level. At this time, since the transistors PA and NB are turned on, the logic power supply potential is output as VBP. Then, if the fuse latch operation completion signal Chrdy rises to the "H" level, the node NC is set at the "L" level and the node NE is set at the "H" level.

In the present example, if the fuse latch operation completion signal Chrdy rises to the "H", the node NC first comes to the "L" level and, after a predetermined time period, the node NE is set at the "H" level. In this way, a predetermined delay time is set in the path from the output terminal of the NOR circuit NOR1 to the gate of the transistor PA, in order to charge the connection node of the transistors PA and NB to the logic power supply potential.

At the program time, if the program signal PMPVBP rises to the "H" level, the node NC rises to the "H" level. During the time period in which the program signal PMPVBP is at the "H" level, the node NC is fixed at the "H" level. At the program time, a high potential (e.g. about 8 V) VBP is output from the VBP generating circuit 11A (see FIG. 2). Thus, if the node NC comes to the "L" level, there is a possibility that the gate of the transistor NB is destroyed. In order to ensure the reliability of the transistor NB, the node NC is fixed at the "H" level.

A time period (A) is neither the read time period nor the program time period. In the time period (A), there is no need to supply VBP from the VBP generating circuit 11A, 11B. Thus, in the time period (A), the signals POR and Chrdy are set at the "H" level, the signal PMPVBP is set at the "L" level, the node NC is set at the "L" level, and the node NE is set at the "H" level. At this time, the VBP is set at 0 V.

4. Third Embodiment

Compared to the first embodiment, a third embodiment of the invention, like the second embodiment, is characterized by the structure of the VBP generating circuit (Power-On). In the third embodiment, too, the read/program potential generating circuit and its peripheral circuits have the same structure as shown in FIG. 2.

Figure 11:
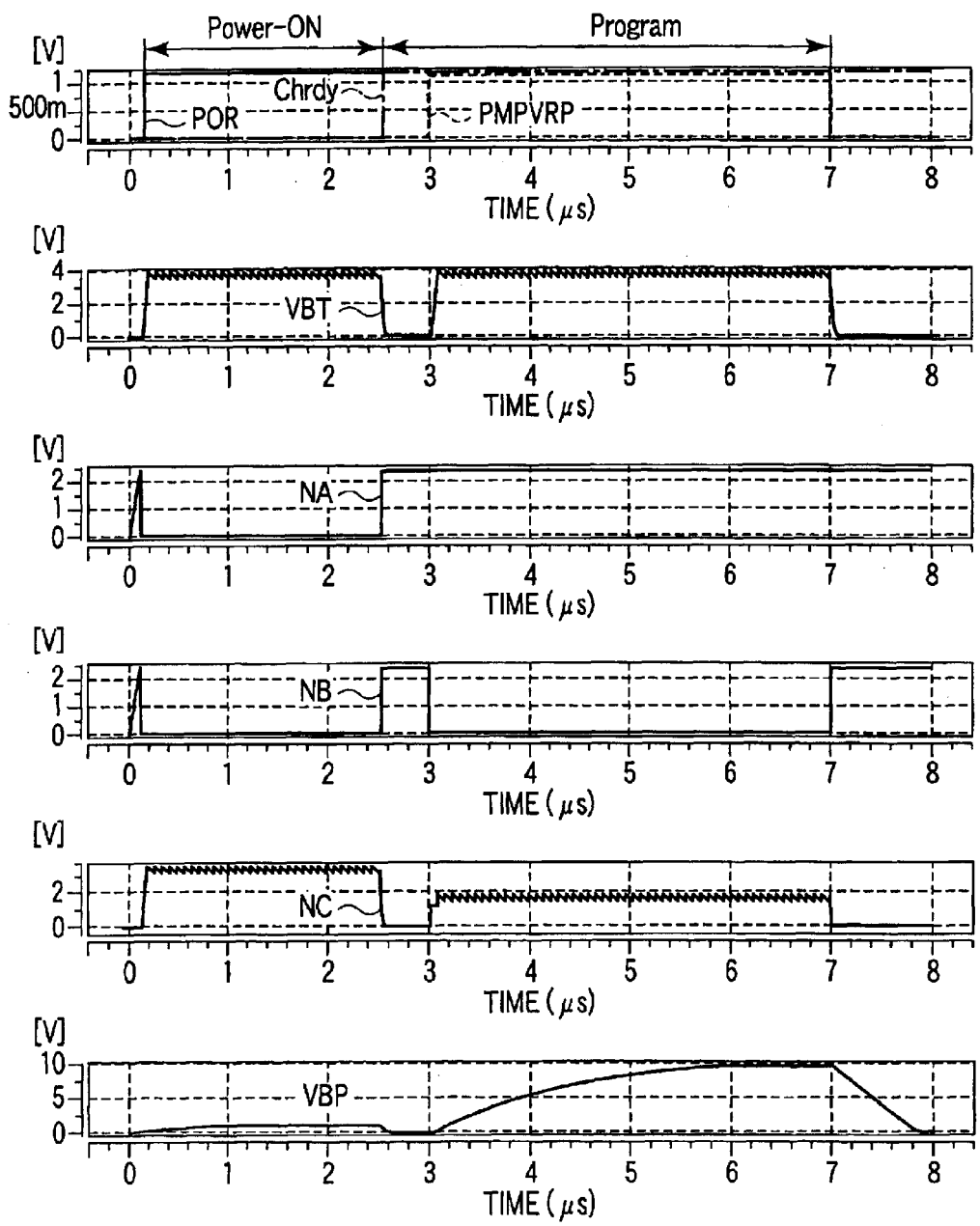
FIG. 11 shows operational waveforms in the circuit shown in FIG. 10.

FIG. 10 shows an example of the VBP generating circuit (Power-On). FIG. 11 shows operational waveforms in the circuit shown in FIG. 10.

A chip activation signal POR is input to a NAND circuit NAND21. A fuse latch operation completion signal Chrdy is input to the NAND circuit NAND21 via an inverter INV21. An output from the NAND circuit NAND21 becomes PRCY.

The output signal PRCY flows through an inverter INV20 and a delay circuit 21 and is input as a signal NE to the gate of an N-channel MOS transistor N25. The drain of the transistor N25 is supplied with a logic power supply potential.

In addition, the output signal PRCY flows through a delay circuit 22 and is input to the gate of an N-channel MOS transistor N21. Further, the output signal PRCY flows through the delay circuit 22 and an inverter INV24 and is input to the gate of an N-channel MOS transistor N22.

A signal VBT is commonly applied to the sources of P-channel MOS transistors P21 and P22. The gate of the transistor P21 is connected to the drain of the transistor P22, and the gate of the transistor P22 is connected to the drain of the transistor P21. The source of the transistor N21 is connected to a ground, and the drain of the transistor N21 is connected to the drain of the transistor P21. The source of the transistor N22 is connected to a ground, and the drain of the transistor N22 is connected to the drain of the transistor P22.

A signal NA is output from a connection node of the transistors P22 and N22. The signal NA is input to the gate of a P-channel MOS transistor P23. The source of the transistor P23 is supplied with VBT.

Further, the output signal PRCY of the NAND circuit NAND21 is input to a NOR circuit NOR21 via an inverter INV22. A program signal PMPVBP is also input to the NOR circuit NOR21. An output signal NB of the NOR circuit NOR21 is input to the gate of an N-channel MOS transistor N23. The source of the transistor N23 is connected to a ground, and the drain of the transistor N23 is connected to the drain of the transistor P23.

A signal NC is output from a connection node of the transistors P23 and N23. The signal NC is input to the gate of an N-channel MOS transistor N26. The drain of the transistor N26 is connected to the source of the transistor N25, and a signal VBP is output from the source of the transistor N26.

The program signal PMPVBP flows through a delay circuit 23 and is input to the gate of an N-channel MOS transistor N27. In addition, the program signal PMPVBP is also input to the gate of an N-channel MOS transistor N28 via the delay circuit 23 and an inverter INV23.

A signal VBT is commonly applied to the sources of P-channel MOS transistors P25 and P26. The gate of the transistor P25 is connected to the drain of the transistor P26, and the gate of the transistor P26 is connected to the drain of the transistor P25. The source of the transistor N27 is connected to a ground, and the drain of the transistor N27 is connected to the drain of the transistor P25. The source of the transistor N28 is connected to a ground, and the drain of the transistor N28 is connected to the drain of the transistor P26.

A signal NG is output from a connection node of the transistors P25 and N27. The signal NG is input to the gate of a P-channel MOS transistor P24. A signal NF is output from a connection node of the transistors P26 and N28. The signal NF is input to the gate of an N-channel MOS transistor N24.

The source of the transistor P24 is supplied with a logic power supply potential, and the source of the transistor N24 is connected to the gate of the transistor N26.

Basic operations are described.

At the read (Power-On) time, if the chip activation signal POR is set at the "H" level by Power-On in the state in which Chrdy="L" and PMPVBP="L", the output signal PRCY of the NAND circuit NAND21 is set at the "L" level. As a result, NE="H", NA="L", NB="L", and NC="H". In addition, the transistors N25 and N26 are both turned on, and the logic power supply potential is output as VBP.

Then, if the fuse latch operation completion signal Chrdy rises to the "H" level, the output signal PRCY of the NAND circuit NAND21 is set at the "H" level. As a result, NE="L", NA="H", NB="H", and NC="L". In addition, the transistors N25 and N26 are both turned off.

In the present example, if the fuse latch operation completion signal Chrdy rises to the "H", the node NC first comes to the "L" level and, after a predetermined time period, the node NE is set at the "L" level. In this way, the timing for turning off the transistors N25 and N26 is displaced in order to charge the connection node ND3 of the transistors N25 and N26 to the logic power supply potential.

When the transistors N25 and N26 are turned off, the VBP is set at the ground potential (0V).

At the program time, if the program signal PMPVBP rises to the "H" level, the signal NB comes to the "L" level. On the other hand, since NG="L" and NF="H", the transistors P24 and N24 are turned on. As a result, the node NC is charged to the logic power supply potential. In this way, during the time period in which the program signal PMPVBP is at the "H" level, the node NC is fixed at the logic power supply potential. This aims at protecting the gate of the transistor N26, taking into account the fact that at the program time, a high potential (e.g. about 8 V) VBP is output from the VBP generating circuit 11A (see FIG. 2).

5. Fourth Embodiment

Compared to the third embodiment, a fourth embodiment of the invention is characterized by the structure of an output section of the VBP generating circuit (Power-On). In the fourth embodiment, the N-channel MOS transistor N25 (see FIG. 10) in the output section of the VBP generating circuit (Power-On) of the third embodiment is replaced with a P-channel MOS transistor P27.

FIG. 12 shows an example of the VBP generating circuit (Power-On). Operational waveforms in the circuit shown in FIG. 12 are the same as those shown in FIG. 11.

A chip activation signal POR is input to a NAND circuit NAND21. A fuse latch operation completion signal Chrdy is input to the NAND circuit NAND21 via an inverter INV21. An output from the NAND circuit NAND21 becomes PRCY.

The output signal PRCY flows through a delay circuit 21 and is input as a signal NE to the gate of a P-channel MOS transistor P27. The source of the transistor P27 is supplied with a logic power supply potential.

In addition, the output signal PRCY flows through a delay circuit 22 and is input to the gate of an N-channel MOS transistor N21. Further, the output signal PRCY flows through the delay circuit 22 and an inverter INV24 and is input to the gate of an N-channel MOS transistor N22.

A signal VBT is commonly applied to the sources of P-channel MOS transistors P21 and P22. The gate of the transistor P21 is connected to the drain of the transistor P22, and the gate of the transistor P22 is connected to the drain of the transistor P21. The source of the transistor N21 is connected to a ground, and the drain of the transistor N21 is connected to the drain of the transistor P21. The source of the transistor N22 is connected to a ground, and the drain of the transistor N22 is connected to the drain of the transistor P22.

A signal NA is output from a connection node of the transistors P22 and N22. The signal NA is input to the gate of a P-channel MOS transistor P23. The source of the transistor P23 is supplied with VBT.

Further, the output signal PRCY of the NAND circuit NAND21 is input to a NOR circuit NOR21 via an inverter INV22. A program signal PMPVBP is also input to the NOR circuit NOR21. An output signal NB of the NOR circuit NOR21 is input to the gate of an N-channel MOS transistor N23. The source of the transistor N23 is connected to a ground, and the drain of the transistor N23 is connected to the drain of the transistor P23.

A signal NC is output from a connection node of the transistors P23 and N23. The signal NC is input to the gate of an N-channel MOS transistor N26. The drain of the transistor N26 is connected to the drain of the transistor P27, and a signal VBP is output from the source of the transistor N26.

The program signal PMPVBP flows through a delay circuit 23 and is input to the gate of an N-channel MOS transistor N27. In addition, the program signal PMPVBP is also input to the gate of an N-channel MOS transistor N28 via the delay circuit 23 and an inverter INV23.

A signal VBT is commonly applied to the sources of P-channel MOS transistors P25 and P26. The gate of the transistor P25 is connected to the drain of the transistor P26, and the gate of the transistor P26 is connected to the drain of the transistor P25. The source of the transistor N27 is connected to a ground, and the drain of the transistor N27 is connected to the drain of the transistor P25. The source of the transistor N28 is connected to a ground, and the drain of the transistor N28 is connected to the drain of the transistor P26.

A signal NG is output from a connection node of the transistors P25 and N27. The signal NG is input to the gate of a P-channel MOS transistor P24. A signal NF is output from a connection node of the transistors P26 and N28. The signal NF is input to the gate of an N-channel MOS transistor N24.

The source of the transistor P24 is supplied with a logic power supply potential, and the source of the transistor N24 is connected to the gate of the transistor N26.

Basic Operations are Described.

At the read (Power-On) time, if the chip activation signal POR is set at the "H" level in the state in which Chrdy="L" and PMPVBP="L", the output signal PRCY of the NAND circuit NAND21 is set at the "L" level. As a result, NE="L", NA="L", NB="L", and NC="H". In addition, the transistors P27 and N26 are both turned on, and the logic power supply potential is output as VBP.

Then, if the fuse latch operation completion signal Chrdy rises to the "H" level, the output signal PRCY of the NAND circuit NAND21 is set at the "H" level. As a result, NE="H", NA="H", NB="H", and NC="L". In addition, the transistors P27 and N26 are both turned off.

In the present example, if the fuse latch operation completion signal Chrdy rises to the "H", the node NC first comes to the "L" level and, after a predetermined time period, the node NE is set at the "H" level. In this way, the timing for turning off the transistors P27 and N26 is displaced in order to charge the connection node ND3 of the transistors P27 and N26 to the logic power supply potential.

When the transistors P27 and N26 are turned off, the VBP is set at the ground potential (0V).

At the program time, if the program signal PMPVBP rises to the "H" level, the signal NB comes to the "L" level. On the other hand, since NG="L" and NF="H", the transistors P24 and N24 are turned on. As a result, the node NC is charged to the logic power supply potential. In this way, during the time period in which the program signal PMPVBP is at the "H" level, the node NC is fixed at the logic power supply potential. This aims at protecting the gate of the transistor N26, taking into account the fact that at the program time, a high potential (e.g. about 8 V) VBP is output from the VBP generating circuit 11A (see FIG. 2).

6. Summary

The read/program potential generating circuit according to the example of the present invention comprises a VBP generating circuit (Power-On) that generates a potential to be applied to the program element (e.g. E-fuse, antifuse) at the read time (Power-On), and a VBP generating circuit (Program) that generates a potential to be applied to the program element at the program time.

At the read time, for example, the VBP generating circuit (Power-On) generates about 1.2 V or about 2.5 V as VBP. At the program time, for example, the VBP generating circuit (Program) generates about 8 V as VBP. In a time period which is neither the read time nor the program time, the VBP is set at 0 V. In addition, VBT is set at, e.g. about 3.5 V.

Figure 13:
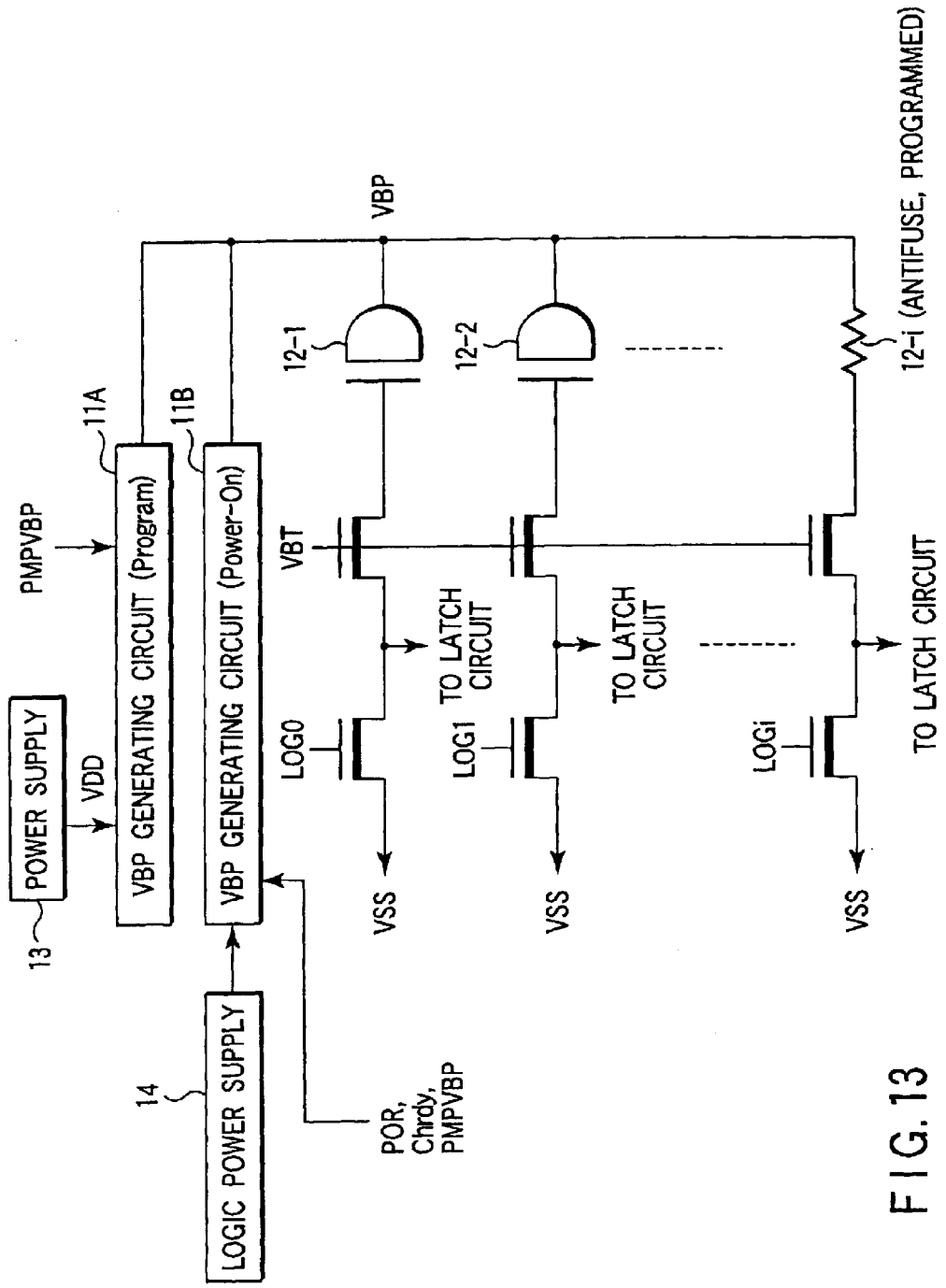
FIG. 13 shows a specific example of a fuse circuit.

In this manner, the three power supply voltages (e.g. 1.2 V, 3.5 V, 8 V) are used, and VBP is set at 0 V at the time other than the read/program time. Thereby, such a situation does not occur that the program potential (8V) is always applied to the program element. In particular, as shown in FIG. 13, for instance, program elements 12-1, 12-2, . . . , 12-i are normally connected in parallel between the VBP node and the ground. In this case, only when necessary, the VBP is set at the program potential (8V), thereby relaxing an excessive voltage stress on the program elements 12-1, 12-2, . . . , 12-i.

Figure 14:
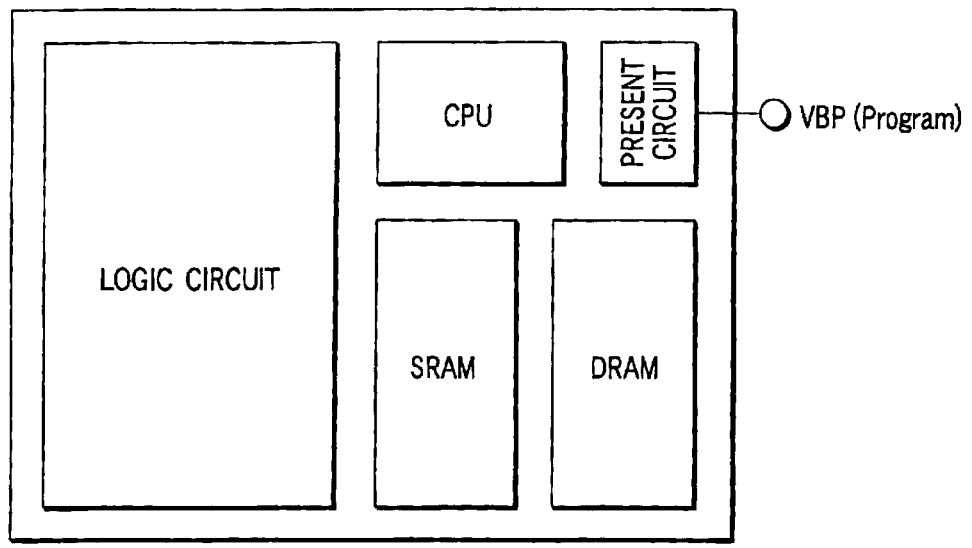
FIG. 14 shows an example of a layout of an embedded LSI including the present circuit.
Figure 15:
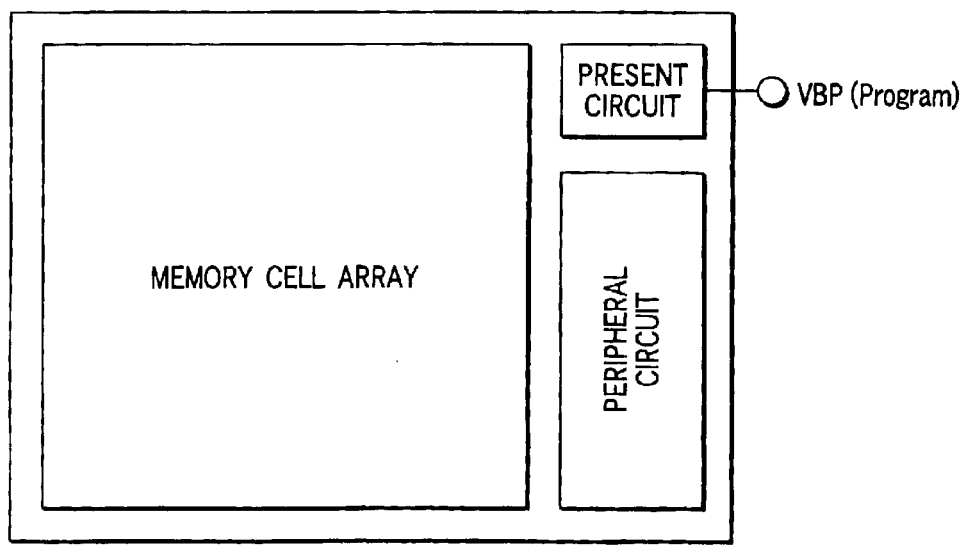
FIG. 15 shows an example of a layout of a general LSI including the present circuit.

Moreover, according to the read/program potential generating circuit relating to the example of the present invention, the VBP generating circuit (Power-On) and VBP generating circuit (Program) are independently provided. Therefore, these circuits and program elements can be arranged at desired locations, and constraints on the layout are eliminated. As regards the VBP generating circuit (Program), as shown in FIGS. 14 and 15, for example, a VBP pin (external terminal) may be provided on the package and a program potential VBP can be supplied from a dedicated power supply (outside of the chip) having a sufficient drive power. By using the dedicated power supply, the layout size can be reduced as a whole even if the number of VBP generating circuits is increased.

The read/program potential generating circuit according to the example of the present invention is effective for a memory-embedded logic LSI in which a logic circuit (e.g. ASIC) and a memory circuit (e.g. DRAM, SRAM) are mounted. In this embedded LSI, for instance, the read/program potential generating circuit according to the example of the present invention can be applied to the programming of defective addresses in the memory circuit (redundancy circuit).

Furthermore, in a system LSI as shown in FIG. 14, for example, the present circuit (read/program potential generating circuit) can be disposed at a desired location within the chip. Symbol VBP (Program) denotes a VBP pin provided on the package. In this example, a dedicated power supply for programming is taken into the chip via the VBP pin from the outside of the chip.

Besides, as shown in FIG. 15, for example, the read/program potential generating circuit according to the example of the present invention is applicable not only to the embedded LSI but also to a general LSI (general-purpose memory). The reason is that even in the general LSI, a problem may arise with the reliability of transistors against voltage stress due to miniaturization of devices. In this case, too, the present circuit (read/program potential generating circuit) can be disposed at a desired location within the chip.

The potential generated by the read/program potential generating circuit according to the example of the present invention is applicable not only to the read/program of defective addresses in the redundancy circuit, but also to various data programming. In particular, the example of the present invention is effective in the case of programming low-capacity data (e.g. 512 kilobits or less).

The read/program potential generating circuit according to the example of the present invention is applicable to, for example, programming of a chip ID, programming of a security code, and programming of data relating to the contrast of a liquid crystal display of a mobile phone.

The programming for a fuse circuit according to the example of the present invention is executable before or after the assembly step.

7. Others

As has been described above, according to the read/program potential generating circuit relating to the example of the present invention, the following advantages can be obtained. Since each circuit is independently provided, the program element can be disposed at a desired location and constraints on layout are eliminated. By using the dedicated power supply with sufficient drive power, the layout size can be reduced as a whole even if the number of high potential generating circuits is increased. At the time of Power-On, the high potential generating circuit is cut off from the program element and other transistor elements, thereby preventing destruction of the program element and other transistor elements due to voltage stress.

The read/program potential generating circuit according to the example of the present invention is effective, in particular, for a semiconductor integrated circuit having a BIST (Built-in Self Test) function and a BISR (Built-in Self Repair) function.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A read/program potential generating circuit comprising:
   a first potential generating circuit that generates a program potential necessary for programming for a fuse element; and
   a second potential generating circuit that generates a read potential necessary for checking a state of the fuse element,
   wherein a value of the read potential is lower than a value of the program potential.

2. The read/program potential generating circuit according to claim 1, wherein the fuse element is programmed by fusion cutting or dielectric breakdown.

3. A semiconductor device comprising the read/program potential generating circuit according to claim 1 and an external terminal for taking in the program potential.

4. A semiconductor device comprising the read/program potential generating circuit according to claim 1 and a logic circuit driven by a logic power supply potential, wherein the read potential is generated from the logic power supply potential.

5. The read/program potential generating circuit according to claim 1, wherein the programming is executable before or after an assembly step.

6. The read/program potential generating circuit according to claim 1, wherein the programming is executed based on a command from a CPU.

7. The read/program potential generating circuit according to claim 6, wherein the first potential generating circuit is rendered operative by a program signal produced based on the command, and the second potential generating circuit is rendered operative by Power-On and rendered inoperative by completion of fuse data latch.

8. The read/program potential generating circuit according to claim 7, wherein the second potential generating circuit includes a transistor in an output section thereof, and a drain of the transistor is charged before the second potential generating circuit is rendered inoperative by completion of fuse data latch.

9. The read/program potential generating circuit according to claim 7, wherein the second potential generating circuit includes a transistor in an output section thereof, and a gate of the transistor is charged upon reception of the program signal.

10. The read/program potential generating circuit according to claim 1, wherein the checking is executed in sync with Power-On.

11. A fuse circuit comprising:
    the read/program potential generating circuit according to claim 1;
    a node commonly connected to the first and second potential generating circuits;
    the fuse element having one end connected to the node; and
    a barrier transistor connected to the other end of the fuse element.

12. The fuse circuit according to claim 11, wherein the node is set at a ground potential when the program potential is not generated and the read potential is not generated.

13. The fuse circuit according to claim 11, wherein a gate of the barrier transistor is charged when one of the program potential and the read potential is generated.

14. The fuse circuit according to claim 11, wherein one of a chip ID, a security code, and data relating to contrast of a liquid crystal display of a mobile phone, is programmed in the fuse element.

15. A read/program method comprising:
   generating a read potential in sync with Power-On;
   applying the read potential to a fuse element, thereby checking a state of the fuse element;
   generating a program potential higher than the read potential, based on a command from a CPU; and
   applying the program potential to the fuse element, thereby executing programming for the fuse element.

16. The read/program method according to claim 15, wherein a ground potential is applied to the fuse element when none of the read potential and the program potential is applied to the fuse element.

17. The read/program method according to claim 15, wherein the application of the read potential to the fuse element is finished when data in the fuse element is latched in a latch circuit.

18. The read/program method according to claim 15, wherein the programming is executable before or after an assembly step.

* * * * *